(12) United States Patent
Moindron et al.

(10) Patent No.: US 12,302,498 B2
(45) Date of Patent: May 13, 2025

(54) TRANSFORMER IN A PACKAGE SUBSTRATE

(71) Applicant: STMICROELECTRONICS (TOURS) SAS, Tours (FR)

(72) Inventors: Laurent Moindron, Vernou sur Brenne (FR); Ghafour Benabdelaziz, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 193 days.

(21) Appl. No.: 17/947,745

(22) Filed: Sep. 19, 2022

(65) Prior Publication Data

US 2023/0104920 A1    Apr. 6, 2023

(30) Foreign Application Priority Data

Oct. 1, 2021   (FR) ...................................... 2110416

(51) Int. Cl.
*H05K 1/16*   (2006.01)
*H01F 27/28*  (2006.01)
*H05K 1/18*   (2006.01)

(52) U.S. Cl.
CPC ......... *H05K 1/165* (2013.01); *H01F 27/2804* (2013.01); *H05K 1/181* (2013.01); *H01F 2027/2809* (2013.01)

(58) Field of Classification Search
CPC .... H05K 1/165; H05K 1/181; H01F 27/2804; H01F 2027/2809
See application file for complete search history.

(56) References Cited

U.S. PATENT DOCUMENTS

| | | |
|---|---|---|
| 6,480,086 B1 | 11/2002 | Kluge et al. |
| 2003/0075990 A1 | 4/2003 | Guitton et al. |
| 2005/0003199 A1 | 1/2005 | Takaya et al. |
| 2007/0030659 A1* | 2/2007 | Suzuki .................. H05K 1/165 336/200 |
| 2009/0046489 A1* | 2/2009 | Yoshimura .......... H01F 17/0013 336/173 |
| 2010/0026368 A1 | 2/2010 | Tang et al. |
| 2011/0075449 A1 | 3/2011 | Fouquet |
| 2017/0148732 A1* | 5/2017 | Kuwajima .............. H01L 24/48 |
| 2019/0237247 A1 | 8/2019 | Nanjyo et al. |
| 2020/0013729 A1 | 1/2020 | Washida et al. |
| 2020/0287520 A1* | 9/2020 | Kamgaing ........... H03H 9/1014 |
| 2020/0365532 A1 | 11/2020 | Male et al. |
| 2021/0258045 A1* | 8/2021 | Lueders ................ H05K 1/162 |
| 2021/0305207 A1 | 9/2021 | Arora et al. |
| 2021/0398739 A1* | 12/2021 | Yen ........................ H01F 27/29 |

(Continued)

FOREIGN PATENT DOCUMENTS

| | | |
|---|---|---|
| CN | 101388608 A | 3/2009 |
| CN | 102867627 A | 1/2013 |

(Continued)

*Primary Examiner* — Hoa C Nguyen

(74) *Attorney, Agent, or Firm* — Seed IP Law Group LLP

(57) ABSTRACT

The present description concerns a device comprising at least one chip in a package, the package comprising a support, having the at least one chip resting thereon, and a protection layer covering the at least one chip, the support comprising a stack of layers made of an insulating material, a transformer being formed in the support by first and second conductive tracks.

20 Claims, 6 Drawing Sheets

(56) References Cited

U.S. PATENT DOCUMENTS

| | | | | |
|---|---|---|---|---|
| 2022/0344260 A1* | 10/2022 | Tange | ................ | H01F 27/2804 |
| 2022/0415829 A1* | 12/2022 | Blecic | .................. | H01L 23/552 |
| 2023/0089019 A1* | 3/2023 | Jung | .................. | H01F 27/2804 |
| | | | | 336/200 |

FOREIGN PATENT DOCUMENTS

| | | |
|---|---|---|
| CN | 209419044 U | 9/2019 |
| EP | 2320458 A1 | 5/2011 |
| KR | 100939755 B1 | 1/2010 |

* cited by examiner

TRANSFORMER IN A PACKAGE SUBSTRATE

BACKGROUND

Technical Field

The present disclosure generally concerns electronic devices and, more specifically, devices comprising a transformer.

Description of the Related Art

An electric transformer is an electric machine enabling to modify the voltage and current intensity values delivered by a source of AC electric energy, into a system of voltage and current of different values, for example, of same frequency. It creates a galvanic isolation between its primary and its secondary.

There exists a plurality of transformer types, for example including transformers where the energy is transferred from the primary to the secondary via a magnetic circuit. These two circuits are then magnetically coupled. This enables to perform a galvanic isolation between the two circuits.

BRIEF SUMMARY

There is a need for a transformer in a package providing a good galvanic isolation.

An embodiment overcomes all or part of the disadvantages of known transformers in a package.

An embodiment provides a device comprising at least one chip in a package, the package comprising a support, having the at least one chip resting thereon, and a protection layer covering the at least one chip, the support further comprising a stack of layers made of an insulating material, a transformer being formed in the support by first and second conductive tracks.

According to an embodiment, the transformer comprises a primary comprising one or a plurality of windings formed by one or a plurality of the first conductive tracks.

According to an embodiment, the primary comprises a single first winding formed by a first conductive track in a single layer of the stack.

According to an embodiment, the transformer comprises a secondary comprising one or a plurality of second windings formed by one or a plurality of the second conductive tracks.

According to an embodiment, the secondary comprises two second windings.

According to an embodiment, each second winding comprises a first portion in a first layer of the stack, and a second portion in a second layer of the stack.

According to an embodiment, the first portions of the second windings are in a same first layer and are interlaced, and the second portions are in the same second layer, and are interlaced.

According to an embodiment, a first end of one of the second windings is coupled to a first end of the other one of the second windings.

According to an embodiment, the first ends of the second windings are coupled to a contact pad located in the lower layer of the support.

According to an embodiment, the first and second tracks each form a spiral surrounding a first region.

According to an embodiment, a control circuit is located on the support, opposite the first region.

According to an embodiment, a rectifying circuit is located on a region of the support external to the spirals formed by the first and second windings.

According to an embodiment, the support, the control circuit, and the rectifying circuit are covered with an overmolding layer.

According to an embodiment, second ends of the second windings are coupled to the second circuit.

According to an embodiment, the first and second conductive tracks are separated by layers of the stack which do not comprise conductive tracks in the region opposite the first and second conductive tracks.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1:
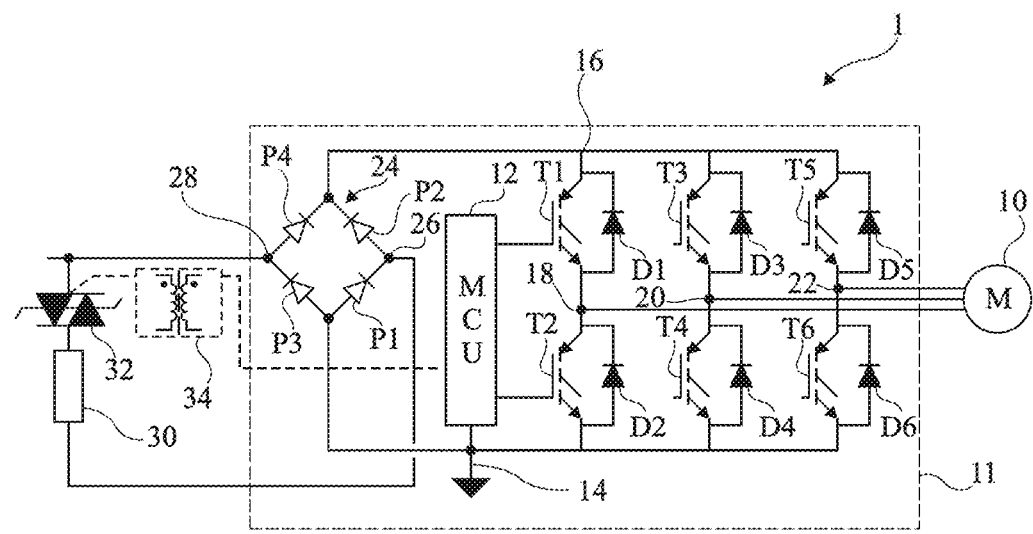
FIG. 1 shows an example of application of the embodiments.

FIG. 1 shows an example of application of the embodiments described hereafter. In particular, FIG. 1 illustrates the application of a transformer to the control of a triac. As a variant, the embodiment of the transformer may also be applied to the control of a thyristor, the thyristor then replacing the triac.

FIG. 1 shows a circuit 1 comprising a motor 10. Circuit 1 for example corresponds to a circuit of a washing machine.

Circuit 1 comprises a control circuit 11. The control circuit comprises a microcontroller 12 (MCU). Microcontroller 12 is coupled, preferably connected, to a reference node 14. Node 14 for example corresponds to a ground.

Circuit 1 comprises two transistors T1 and T2 coupled, preferably connected, in series between node 14 and a node 16. More precisely, transistor T1 is coupled, preferably connected, by its conduction terminals, for example drain and source, between node 16 and a node 18. Transistor T2 is coupled, preferably connected, by its conduction terminals, between node 18 and node 14. Transistors T1 and T2 are for example controlled by microcontroller 12. The control terminals of transistors T1 and T2 are thus coupled, preferably connected, to microcontroller 12.

Similarly, circuit 1 comprises two transistors T3 and T4 coupled, preferably connected, in series between node 14 and node 16. More precisely, transistor T3 is coupled, preferably connected, by its conduction terminals between node 16 and a node 20. Transistor T4 is coupled, preferably connected, by its conduction terminals, between node 20 and node 14. Transistors T3 and T4 are for example controlled by microcontroller 12. The control terminals of transistors T3 and T4 are thus coupled, preferably connected, to microcontroller 12. To simplify FIG. 1, the links between the control terminals of transistors T3 and T4 and microcontroller 12 are not shown.

Further, circuit 1 comprises two transistors T5 and T6 coupled, preferably connected, in series between node 14 and node 16. More precisely, transistor T5 is coupled, preferably connected, by its conduction terminals between node 16 and a node 22. Transistor T6 is coupled, preferably connected, by its conduction terminals, between node 22 and node 14. Transistors T5 and T6 are for example controlled by microcontroller 12. The control terminals of transistors T5 and T6 are thus coupled, preferably connected, to microcontroller 12. To simplify FIG. 1, the links between the control terminals of transistors T5 and T6 and microcontroller 12 are not shown.

Each transistor T1, T2, T3, T4, T5, T6 is coupled, preferably connected, in parallel with a diode D1, D2, D3, D4, D5, D6. Thus, diode D1, respectively D3, D5 is coupled, preferably connected, by its cathode to node 16 and by its anode to node 18, respectively 20, 22. Further, diode D2, respectively D4, D6, is coupled, preferably connected, by its cathode to node 18, respectively 20, 22, and by its anode to node 14.

Circuit 11 further comprises a diode bridge 24. Diode bridge 24 comprises two diodes P1 and P2 coupled, preferably connected, in series between node 14 and node 16. Diode bridge 24 comprises two other diodes P3 and P4 coupled, preferably connected, in series between node 14 and node 16. Diode P1 is coupled, preferably connected, to node 14 by its anode and to a node 26 by its cathode. Diode P2 is coupled, preferably connected, to node 26 by its anode and to node 16 by its cathode. Diode P3 is coupled, preferably connected, to node 14 by its anode and to a node 28 by its cathode. Diode P4 is coupled, preferably connected, to node 28 by its anode and to node 16 by its cathode.

Circuit 1 comprises a load 30. Load 30 is series-coupled with a triac 32 between node 26 and node 28. More precisely, a terminal of load 30 is coupled, preferably connected, to node 26 and another terminal of the load is coupled, preferably connected, to an anode of triac 32. The other anode of triac 32 is coupled, preferably connected, to node 28. The power supply of load 30 is for example controlled by triac 32. Load 30 is for example powered by the mains.

Circuit 1 further comprises a transformer circuit 34. An example of a transformer circuit is described in relation with FIG. 2. Circuit 34 is coupled between microcontroller 12 and the control terminal of triac 32. Thus, a terminal of circuit 34 is coupled, preferably connected, to microcontroller 12 and another terminal of circuit 34 is coupled, preferably connected, to the control terminal of triac 32.

Control circuit 11 and the assembly comprising triac 32 and load 30 are in different voltage domains, in other words, are referenced to different reference voltages. Node 28 forms the reference node of triac 32, that is, the ground of the triac. In other words, node 28 forms the reference node of the voltage domain of the assembly comprising the triac and the load. Node 14 forms the reference node, that is, the ground, of the voltage domain of circuit 11. The control signal of the triac, generated by circuit 12, passes from one voltage domain to the other via circuit 34, and more precisely via the induction coils, or windings, of the transformer. The galvanic isolation of the transformer, that is, in practice, the distance between the windings of the primary and of the secondary, thus is an important criterion of circuit 34.

There thus exists a need for a transformer circuit having a strong galvanic isolation.

Figure 2:
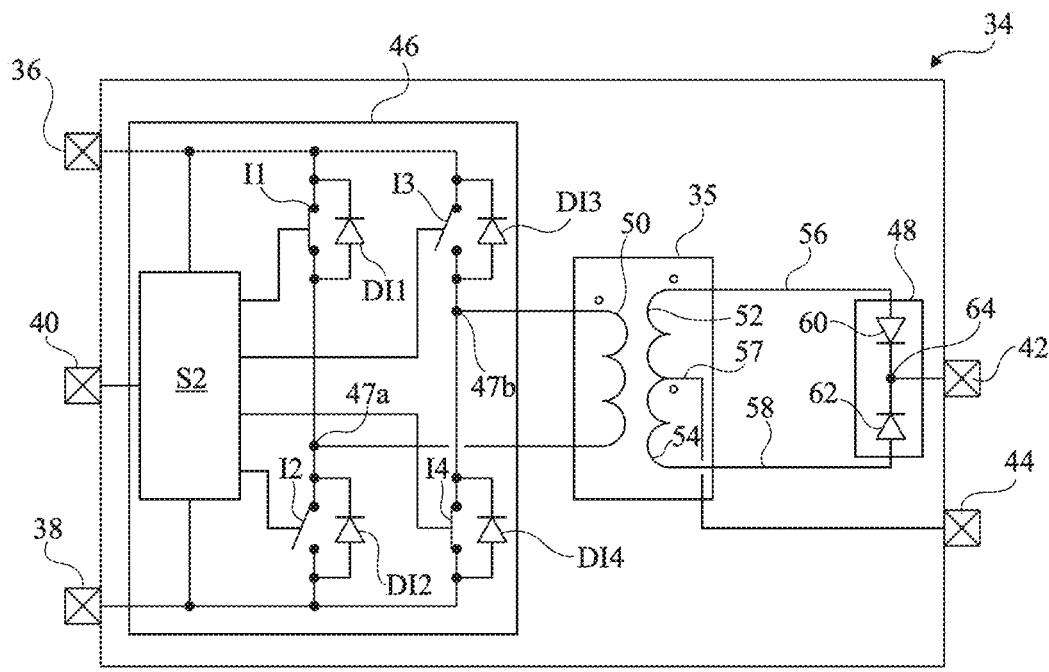
FIG. 2 shows an example of a circuit to which the embodiments may be applied.

FIG. 2 shows an example of a circuit to which the embodiments may be applied. More precisely, FIG. 2 schematically shows a transformer circuit for example corresponding to the circuit 34 of FIG. 1. The transformer is for example a static transformer.

Circuit 34 for example comprises five input and/or output terminals 36, 38, 40, 42, 44. Circuit 34 receives, between terminals 36 and 38, a DC power supply voltage VDD. For example, terminal 36 receives power supply voltage VDD and terminal 38 receives a reference voltage GND. Reference voltage GND for example corresponds to the reference voltage on node 14 of FIG. 1. Circuit 34 for example receives a signal EN on node 40. Signal EN is for example a control voltage. Circuit 34 delivers between terminals 42 and 44 an output voltage Vout.

Circuit 34 comprises a control circuit 46, or driver, of a transformer 35. Circuit 46 is coupled, preferably connected, to terminals 36, 38, and 40. Circuit 46 comprises two switches I1 and I2 coupled, preferably connected, in series between terminal 38 and terminal 36. More precisely, a terminal of switch I1 is coupled, preferably connected, to node 36 and another terminal of switch I1 is coupled, preferably connected, to a node 47a. A terminal of switch I2 is coupled, preferably connected, to node 38 and another terminal of switch I2 is coupled, preferably connected, to node 47a. Further, circuit 46 comprises two switches I3 and I4 coupled, preferably connected, in series between terminal 38 and terminal 36. More precisely, a terminal of switch I3 is coupled, preferably connected, to node 36 and another terminal of switch I3 is coupled, preferably connected, to a node 47b. A terminal of switch I4 is coupled, preferably connected, to node 38 and another terminal of switch I4 is coupled, preferably connected, to node 47b.

Each switch I1, I2, I3, I4 is coupled, preferably connected, in parallel with a diode DI1, DI2, DI3, DI4. Thus, diode DI1, respectively DI3 is coupled, preferably connected, by its cathode to node 36 and by its anode to node 47a, respectively 47b. Further, diode DI2, respectively DI4 is coupled, preferably connected, by its cathode to node 47a, respectively 47b, and by its anode to node 38. Diodes DI1, DI2, DI3, DI4 are for example the intrinsic diodes of switches I1, I2, I3, I4 in the case where said switches are transistors, for example, metal oxide semiconductor field-effect transistors (MOSFET).

Circuit 46 further comprises a circuit 52 for controlling switches I1, I2, I3, I4. Circuit 52 for example receives power supply voltage VDD and signal EN. Circuit 52 is thus coupled, preferably connected, to terminals 36, 38, 40. Circuit 52 is further coupled, preferably connected, to the control terminals of switches I1, I2, I3, I4.

Control circuit 46 is coupled, preferably connected, to transformer 35. More precisely, circuit 46 is coupled, preferably connected, to the primary coil or winding, in other words to the primary, of transformer 35. The primary coil comprises a winding 50, preferably a single winding. One end of winding 50 is coupled, preferably connected, to node 47a and its other end is coupled, preferably connected, to node 47b.

The secondary coil or winding, in other words, the secondary, of transformer 35 comprises, in the example of FIG. 2, two windings 52, 54 in series. One end of winding 52 is coupled, preferably connected, to a node 56 and the other end of winding 52 is connected to an end of winding 54. The other end of winding 54 is coupled, preferably connected, to a node 58. Windings 52 and 54 are thus connected by a junction point 57. Junction point 57 is coupled, preferably connected, to output terminal 44.

Circuit 34 comprises, in the example of FIG. 2, a rectifying circuit 48. Circuit 48 is coupled, preferably connected, to transformer 35, more precisely to the secondary of transformer 35.

Circuit 48 for example comprises two diodes 60, 62 coupled, preferably connected, head-to-tail between nodes 56 and 58. In other words, diode 60 is coupled, preferably connected, between node 56 and a node 64 and diode 62 is coupled, preferably connected, between node 58 and node 64. In other words, the anode of diode 60 is coupled, preferably connected, to node 56 and the cathode of diode 60 is coupled, preferably connected, to node 64. Similarly, the anode of diode 62 is coupled, preferably connected, to node 58 and the cathode of diode 62 is coupled, preferably connected, to node 64. Node 64, that is, the node between diodes 60 and 62, is coupled, preferably connected, to output terminal 42.

As a variant, the secondary of transformer 35 may comprise a single winding. Circuit 48 would for example be a diode bridge.

As a variant, transformer 35 may comprise a plurality of secondaries independent from one another, each coupled with a rectifier circuit.

The different elements of circuit 34, in other words circuits 46 and 48 and transformer 35, are preferably located in a same package, which may be coupled, via terminals 36, 38, 40, 42, 44, to other circuits and to other electronic elements.

In the example of architecture shown in FIG. 2, the control of the transformer is set by the oscillator embedded in circuit 46. There exist other examples of architectures, self-oscillating circuits, where the control of the transformer is obtained due to an interaction between a winding of the transformer and the control circuit. Further, certain self-oscillating circuits comprise one or a plurality of capacitors. The embodiments described hereafter are also applicable to such self-oscillating circuits.

Figure 3A:
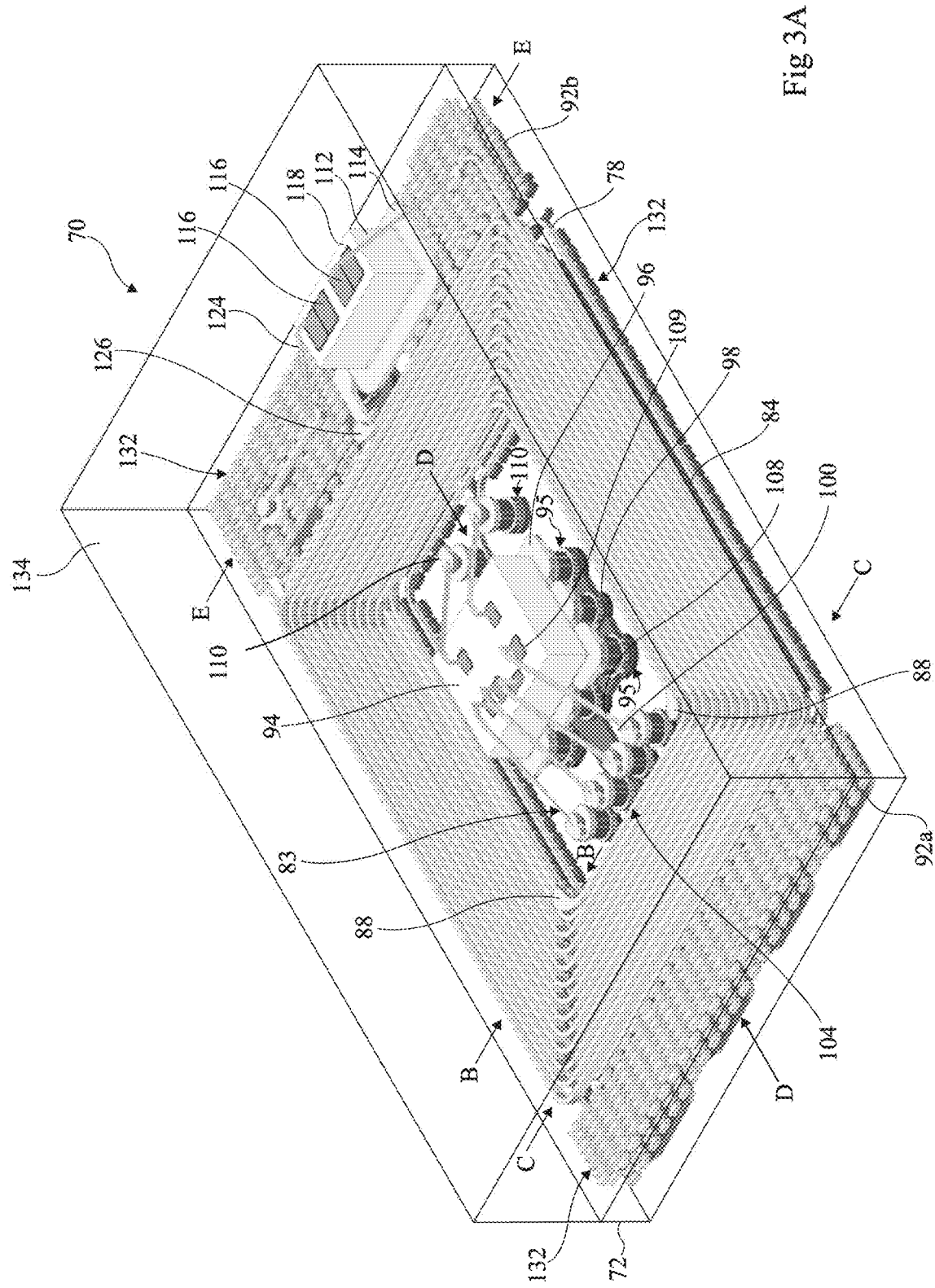
FIG. 3A shows a perspective view of an embodiment of a package comprising a transformer.
Figure 3B:
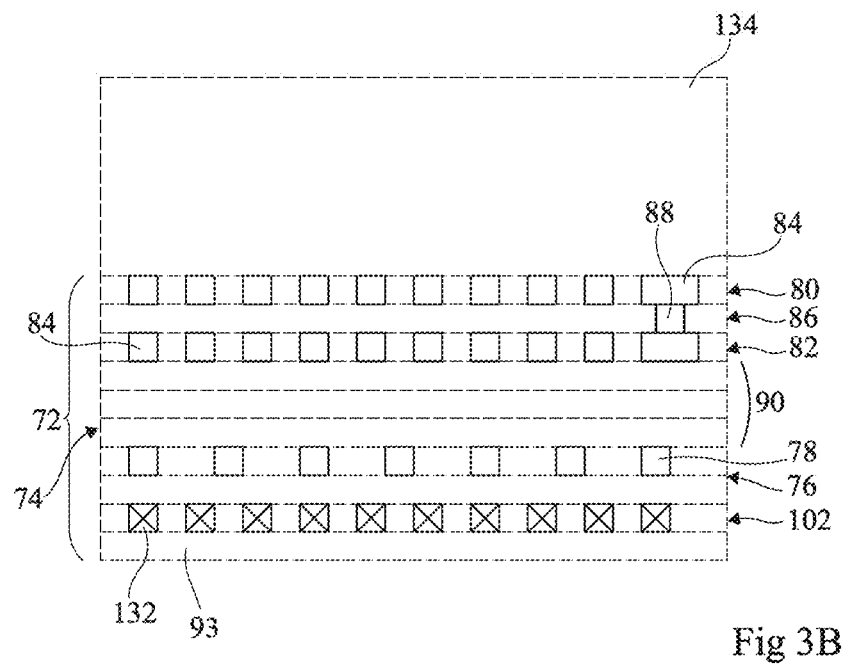
FIG. 3B shows a cross-section view of the embodiment of FIG. 3A.
Figure 3C:
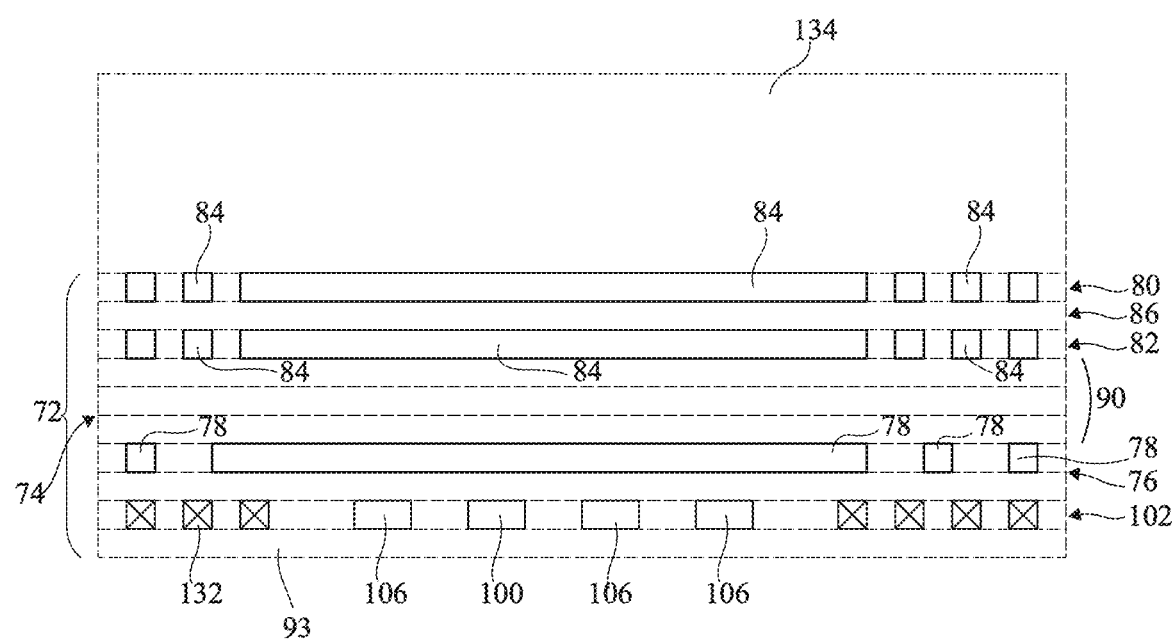
FIG. 3C shows another cross-section view of the embodiment of FIG. 3A.
Figure 3D:
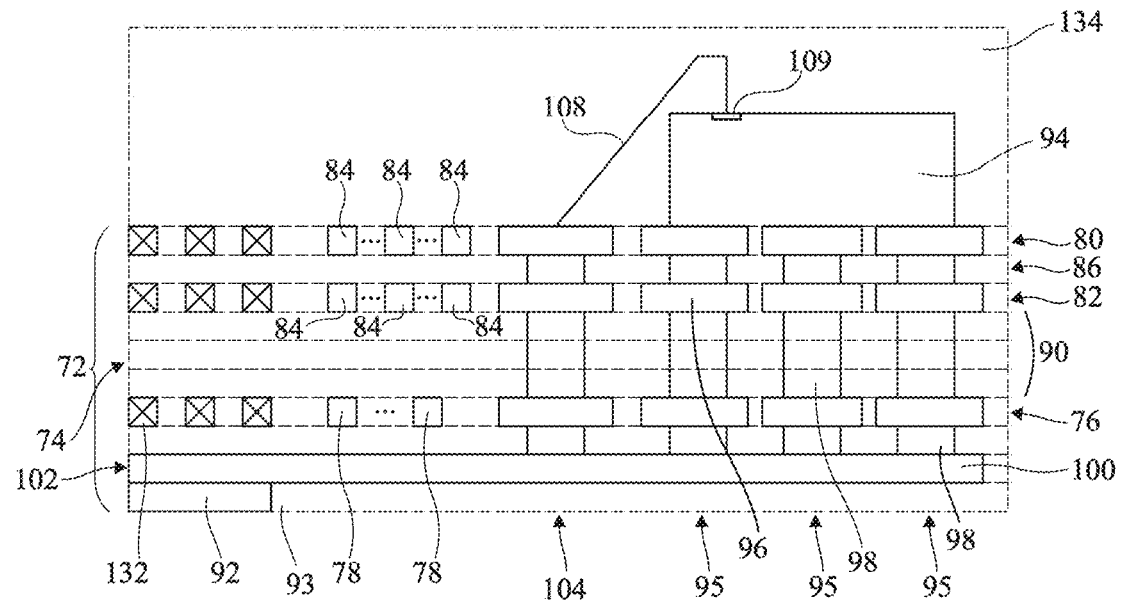
FIG. 3D shows another cross-section view of the embodiment of FIG. 3A.
Figure 3E:
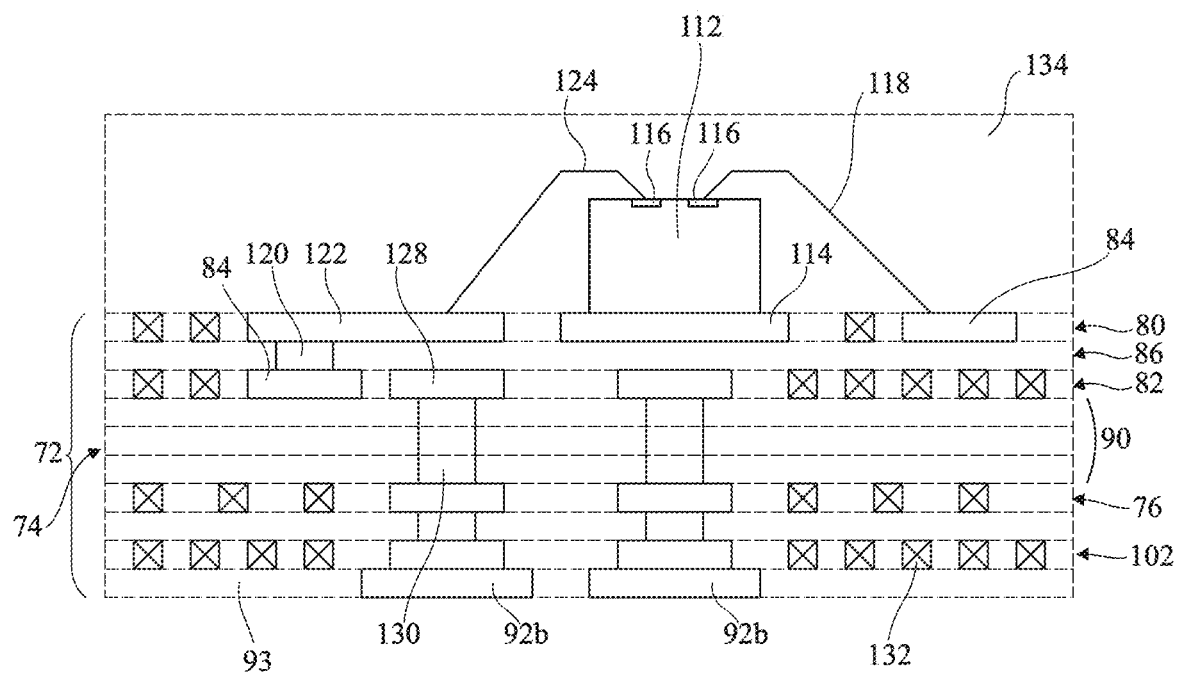
FIG. 3E shows another cross-section view of the embodiment of FIG. 3A.

FIG. 3A shows a perspective view of an embodiment of a device, or system, in package. The device is a transformer device comprising a package 70, the package comprising a transformer circuit, for example, the circuit 34 of FIGS. 1 and 2. FIG. 3B shows a cross-section view of the embodiment of FIG. 3A. The cross-section view of FIG. 3B is in a plane B-B of FIG. 3A. FIG. 3C shows another cross-section view of the embodiment of FIG. 3A. The cross-section view of FIG. 3C is in a plane C-C of FIG. 3A. FIG. 3D shows another cross-section view of the embodiment of FIG. 3A. The cross-section view of FIG. 3D is in a plane D-D of FIG. 3A. FIG. 3E shows another cross-section view of the embodiment of FIG. 3A. The cross-section view of FIG. 3E is in a plane E-E of FIG. 3A.

Package 70 comprises a substrate or support 72. Substrate 72 corresponds to a lower portion of package 70. Substrate 72 is a multilayer substrate comprising conductive tracks and vias. In other words, substrate 72 comprises a stack of layers or levels 74, for example, made of one or a plurality of electrically-insulating materials, for example, made of resin, for example, of epoxy resin and of glass fibers, conductive tracks and conductive vias, for example, made of metal, for example, of copper, being located in the layers of the stack. Each conductive track or conductive via preferably crosses the layer where it is located. The different layers 74 of the stack can be distinguished by dotted lines in FIGS. 3B to 3E.

The transformer 35 of FIG. 2 is located in substrate 72. More precisely, windings 50, 52, and 54 are formed by conductive tracks of substrate 72.

Substrate 72 for example comprises a layer 76 of the stack comprising a conductive track 78 forming the primary of the transformer, that is, the winding 50 of FIG. 2. Winding 50, that is, track 78, is preferably located in a single layer of the stack.

Substrate 72 for example comprises at least one layer of the stack, preferably two layers 80 and 82 of the stack, where the secondary of the transformer, that is, windings 52 and 54 in the case of the circuit 34 of FIG. 2, is formed. Layers 80 and 82 comprise conductive tracks 84 forming windings 52 and 54. An embodiment of the arrangement of tracks 84 is described hereafter in relation with FIG. 4.

In the example of FIGS. 3A to 3E, a portion of each of windings 52 and 54 is located in each layer 80, 82. As a variant, each layer 80, 82 might comprise single winding.

Preferably, windings 50, 52, and 54 are located one above the others. In other words, the region of layer 76 comprising winding 50 is located opposite, that is, vertically aligned with, the portion of each layer 80, 82 comprising windings 52, 54.

Conductive track 78 for example has the shape of a spiral in layer 76. Similarly, tracks 84 are preferably spiral-shaped. The spirals formed by tracks 78 and 84 extend around a portion 83 of the stack of substrate 72. Thus, portion 83 does not comprise conductive tracks 78 and 84. In other words, portion 83 comprises no winding of the transformer. In other words, respective central openings of the primary and the secondary are aligned with each other and overlap each other.

In the example of FIGS. 3A to 3E, layer 80 is located above layer 82. Further, layer 82 is located above layer 76.

Preferably, the layers 80 and 82 of the stack are separated by at least one layer 86. The portion of layer 86 located between tracks 84 forming windings 52 and 54 preferably comprises no conductive tracks or conductive vias, except, for example, for one or a plurality of vias 88 coupling tracks 84 together. In other words, the portion of layer 86 located between the tracks 84 of layers 80 and 82 forming windings 52 and 54 only comprises the insulating material of layer 86, except for vias 88. In the example of FIGS. 3A to 3E, layer 86 comprises two vias 88. Each of vias 88 couples the portion of one of windings 52, respectively 54, located in layer 80 to the portion of winding 52, respectively 54, located in layer 82. Vias 88 are preferably in contact with the ends of the conductive tracks. Thus, conductive tracks, that is, the windings, may be continuous over a plurality of levels.

Layer 82 is separated from layer 76 by at least one layer 90 of the stack. The portion of layers 90 located between the tracks 84 of level 82 and the tracks 78 of layer 76 preferably comprises no conductive tracks. In other words, the portions of layers 90 located between the tracks 84 of layer 82 and the tracks 78 of layer 76 only comprise the insulating material of layers 90.

The selection of the number and of the thickness of the layers 86 separating layers 80 and 82 as well as the number and the thickness of layers 90 between layer 82 and layer 76 enables to determine the distance between windings and in particular between the windings of the primary and of the secondary. This particularly enables to select the galvanic isolation between the primary and the secondary, as well as the magnetic coupling between the primary and secondary windings of the transformer. It is thus easier to form a precise thickness between the primary and the secondary, by selecting the number of layers between the primary and the secondary. It is thus not useful to provide a significant thickness, greater than the desired thickness, which enables to decrease the dimensions of the transformer.

The thickness of the layers of the stack, in particular the thickness of layers 76, 80, and 82, that is, the thickness of tracks 84 and 78, as well as the dimensions of tracks 78 and 84 in the layers, may be selected according to the desired characteristics of windings 50, 52, and 54. In particular, the conductive tracks may have sufficiently high dimensions to enable the passage of significant currents, for example, greater than 200 mA. The transformer can thus be configured to allow the high-frequency transmission of the control or power signals.

Substrate 72 comprises contact pads 92. Contact pads 92 are located in a layer 93 of the stack. Layer 93 is the lower layer of the stack. Pads 92 are flush with the lower surface of layer 93, and thus the lower surface of the package. The package may thus be electrically connected to other circuits via connection pads 92. Preferably, pads 92 are located at the periphery of, that is, around, in other words outside of, the portion of layer 93 located opposite tracks 78 and 84. Pads 92 are thus not located opposite, that is, are not vertically aligned with, conductive tracks 78 and 84. Preferably, pads 92 are located outside of the region located opposite conductive tracks 78, 84. Preferably, pads 92 are not located opposite region 83 surrounded with conductive tracks 78, 84.

Pads 92 are preferably divided into two groups of pads. A first group of pads 92a corresponds to the terminals coupled on the side of the control circuit 46 of FIG. 2, that is, terminals 36, 38, 40 in the example of FIG. 2. A second group of pads 92b corresponds to the terminals coupled on the side of the rectifying circuit 48 of FIG. 2, that is, terminals 42, 44 in the example of FIG. 2. Preferably, the first and second groups are opposite to each other in the package. Preferably, the pads of the first and second groups are located in the package so as to maximize the distance between the first and second groups, and thus to maximize the galvanic isolation of the package (creepage distance). In other words, the pads of the first group are located on one side of conductive tracks 78, 84 and the pads of the second group are located on the opposite side of conductive tracks 78, 84. The pads 92a of the first group are thus separated from the pads 92b of the second group by the region located opposite conductive tracks 78, 84 and region 83.

Package 70 comprises a chip or die 94 comprising circuit 46, that is, the transformer control circuit. Chip 94 rests on substrate 72. Chip 94 preferably rests on region 83, that is, on the substrate region surrounded with conductive tracks 78 and 84. Chip 94 is preferably not opposite, that is, vertically aligned with, windings 50, 52, 54, to avoid the forming of a coupling capacitor between 94 chip and the windings. The chip 94 is aligned with and overlaps the first and second central openings of the primary and secondary at the region 83.

Chip 94 for example rests on one or a plurality of stacks 95 of conductive tracks 96 and of conductive vias 98 located in region 83, to couple chip 94 to one or a plurality of conductive tracks 100 extending, in a layer 102, all the way to one or a plurality of pads 92. Each stack 95 preferably comprises a conductive track in the upper layer of the substrate, that is, the layer having chip 94 resting thereon. Track(s) 100 thus extend under the conductive tracks. Layer 102 is for example a layer lower than layers 76, 80, and 82. Layer 102 is for example a layer located between layer 76 and the lower layer of substrate 72. The stacks 95 having the chip resting thereon enable to dissipate the heat and thus to discharge to the outside of the package the power dissipated by the chip.

In the example of FIGS. 3A to 3E, layer 102 is the layer directly above the lower layer of the substrate. Track 100 at least partially extends above pad 92 and is thus in contact with pad 92. As a variant, layer 102 may be separated from the lower layer of substrate 72 by other layers, not shown, track 100 then being coupled to pad 92 by conductive vias, not shown.

More precisely, in the example of FIGS. 3A to 3E, chip 94 rests on a plurality of, for example, nine, stacks of conductive tracks 96 and of conductive vias 98 coupled to a same conductive track 100. Each stack comprises conductive tracks 96, for example, in layers 76, 80, and 82, and conductive vias 98, for example coupling the tracks of layers 76, 80, and 82. Thus, each stack comprises a conductive track in level 80, which is, in the example of FIGS. 3A to 3E, the upper layer of substrate 72. Each stack comprises, in the example of FIGS. 3A to 3E, three conductive tracks, in layers 76, 80, and 82, and three conductive vias, between layers 82 and 80, between layers 82 and 76, and between layer 76 and track 100. Chip 94 is thus coupled by each stack to track 100.

Track 100 extends, in the example of FIGS. 3A to 3E, from region 83, more precisely from the stacks in contact with chip 94, all the way to a pad 92. Said pad 92 is for example configured to be coupled to a ground, for example, to the node 14 of FIG. 1.

The package further comprises stacks 104 of conductive tracks 96, located in layers 80, 82, 76, and of conductive vias 98, located in layers 86, 90 and in the layer located between layers 76 and 102. Stacks 104 are located in region 83. In other words, stacks 104 are separated from pads 92 by the region of the substrate comprising tracks 78 and 84, that is, the transformer windings. Each stack preferably comprises a conductive track in the upper level of the substrate, said conductive track being flush with the upper surface of the substrate. Preferably, the package comprises as many stacks 104 as pads 92a. Each stack 104 is in contact with a conductive track 100 or 106 of level 102. One of stacks 104 is for example in contact with track 100 and each of the other stacks is for example a contact with another conductive track 106.

In the example of FIGS. 3A to 3E, each stack 104 comprises, like stacks 95, conductive tracks 96, for example, in layers 76, 80, and 82, and conductive vias 98 coupling the conductive pads. In particular, each stack comprises a conductive track in layer 82, that is, in the upper layer of the substrate. The conductive track in track 82 is flush with the surface of the substrate.

Each stack 104 is coupled to chip 94 by a connection element, for example, an electric wire or cable 108. Chip 94 for example comprises connection pads 109, for example, at the level of the upper surface of chip 94, enabling chip 94 to receive signals.

Thus, chip 94 may be coupled to elements external to the package via pads 92, tracks 100 or 106, stacks 104, elements 108, and pads 109.

Package 70 comprises, in addition to the stacks 110 of conductive tracks 96 and of conductive vias 98 in substrate 72, preferably two stacks 110. Each stack 110 is coupled to an end of winding 50 (FIG. 2), that is, to an end of the track 76 of layer 76. Stacks 110 are located in region 83. In other words, stacks 110 are separated from pads 92 by the substrate region comprising tracks 78 and 84, that is, the transformer windings.

In the example of FIGS. 3A to 3E, each stack 110 comprises, like stacks 95, conductive tracks 96, for example, in layers 76, 80, and 82, and conductive vias 98 coupling the conductive pads. In particular, each stack comprises a conductive track in layer 82, that is, in the upper layer of the substrate. Further, the track 96 of one of stacks 110 is for example in contact with an end of track 78. For example, the other stack is coupled to the other end of track 76, for example, via a track, not shown, located in another layer of the stack, for example, a layer located under layer 76, for example, located in layer 102.

The conductive track in track 82 is flush with the surface of the substrate. Each stack 110 is, like stacks 104, coupled to chip 94, more precisely to pads 109, by a connection element, for example, an electric wire, or cable, 108.

As a variant, chip 94 may be a flipped chip, electrically coupled to stacks 95, 104, 110, by solder bumps.

Package 70 comprises a chip or die 112 comprising circuit 48 (FIG. 2), that is, the rectifying circuit. Chip 112 rests on substrate 72. Chip 112 is for example located outside of the region located opposite tracks 78 and 84, that is, outside of the windings. The chip is for example located on the side of the windings comprising pads 92b. Chip 112 is for example located opposite, that is, vertically aligned with, a pad 92b.

Chip 112 for example rests on, or is in contact with, a conductive track 114 of the upper level of the substrate, for example, level 80. Track 114 is thus flush with the upper surface of substrate 72. Chip 114 for example comprises a connection pad, not shown, located on its lower surface, in contact with track 114. The connection pad, not shown, is for example coupled, preferably connected, to node 64 (FIG. 2). Track 114 is for example coupled, via conductive tracks and conductive vias located in substrate 72, to a pad 92b. Said pad 92b for example corresponds to terminal 42 (FIG. 2).

Chip 112 comprises, for example on its upper surface, connection pads 116. Each connection pad 116 is for example coupled, preferably connected, to the anode of one of diodes 60, 62 (FIG. 2). One of connection pads 116 is coupled to an end of winding 52 and the other is coupled to an end of winding 54. More precisely, one of pads 116 is for example coupled to an end of the conductive track 84 located in level 80, for example, via an electric wire or cable 118. The other pad 116 is for example coupled to an end of the conductive track 84 located in level 82, for example, via a conductive via 120, a conductive track 122, and an electric wire or cable 124.

As a variant, chip 112 may be a flipped chip, electrically coupled to tracks 122, 114, 84 by solder bumps. Wires 118, 124 may then not be present.

The other end of conductive track 84 located in layer 80 and the other end of conductive track 84 located in layer 82 are for example coupled to each other by a conductive via 126. This connection corresponds to junction point 57 (FIG. 2). Said ends forming point 57 are further coupled to a pad 92b by conductive tracks 128 and conductive vias 130 located in the substrate. Said pad 92b then forms terminal 44.

Substrate 72 further comprises tracks 132. Tracks 132 are dummy tracks, that is, portions of conductive tracks located in the substrate layers enabling to ensure a relatively homogeneous metal density over the entire substrate. In FIGS. 3B to 3E, tracks 132 are shown by crosses. In the example of FIGS. 3A to 3E, the substrate comprises tracks 132 in the layers comprising conductive tracks. For example, the substrate comprises no tracks 132 in the layers only comprising conductive vias. Thus, in the example of FIGS. 3A to 3B, the substrate comprises tracks 132 in layers 80, 82, 76, and 102. Tracks 132 are preferably insulated from one another, and insulated from the conductive tracks and from the conductive vias, for example, by the material of the substrate layers. Tracks 132 preferably have not electric usefulness in the operation of the transformer circuit.

Package 70 comprises a protection layer, or overmolding layer, 134. Layer 134 covers the upper surface of the substrate, that is, the layer having chips 94 and 112 resting thereon, and covers chips 94 and 112. Layer 134 particularly covers the tracks of the upper level of the substrate, that is, the tracks 84, 96, 114, and 122 of layer 80. Layer 134 further covers cables 118 and 124. Layer 134 is for example made of one or a plurality of electrically-insulating materials, for example, made of ceramic, of silicon nitride, or of a resin. Layer 134 may be referred to as a molding compound layer, an encapsulant layer, a resin layer, or some other like or suitable reference to layer 134.

Figure 4:
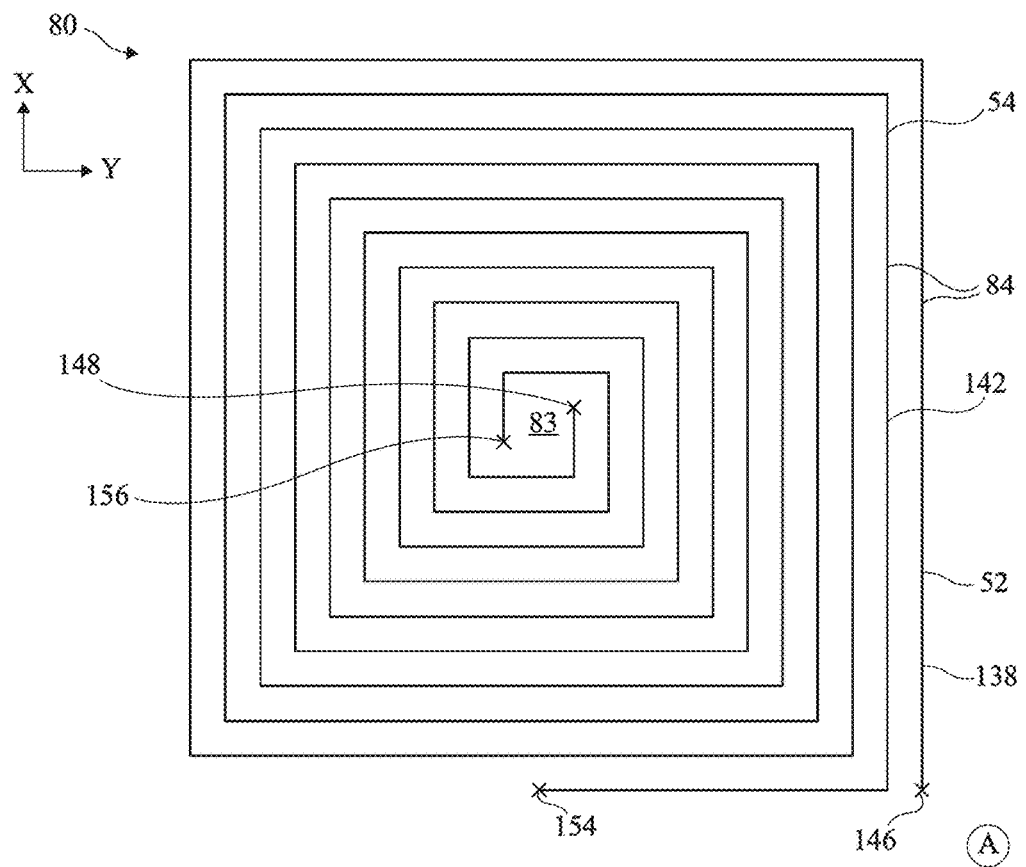
FIG. 4 schematically shows a portion of the embodiment of FIG. 3A.
Figure 4:
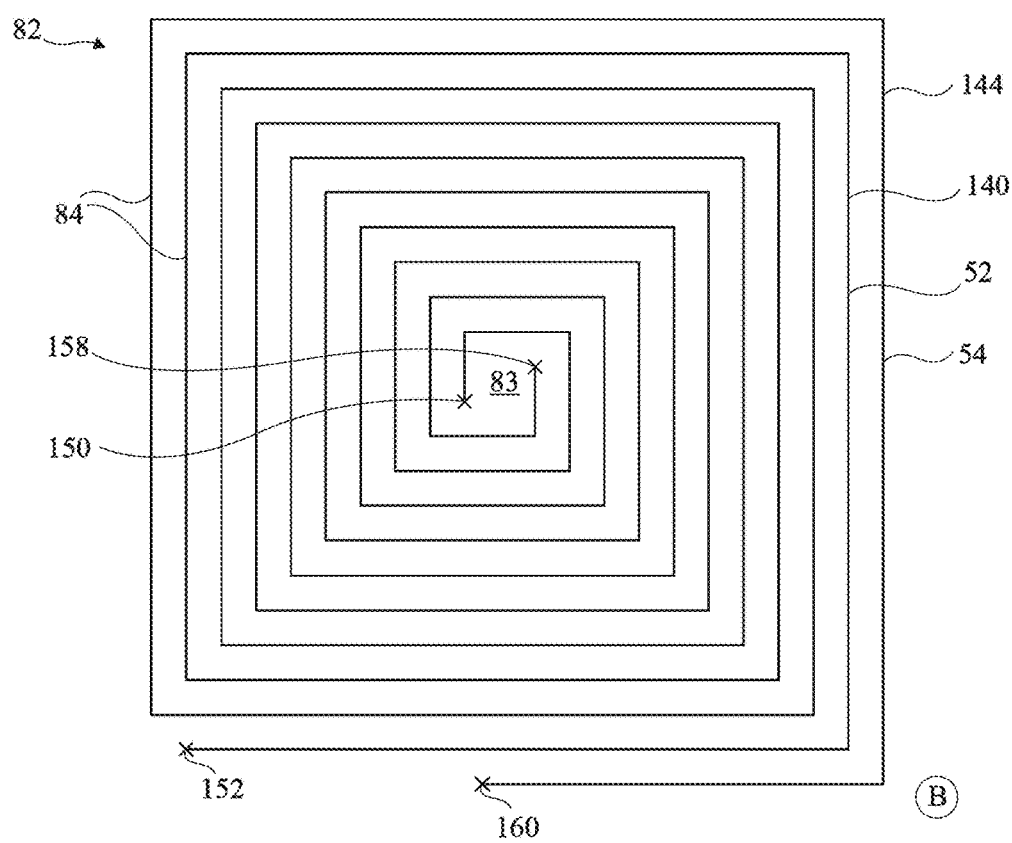

FIG. 4 schematically shows a portion of the embodiment of FIG. 3A. More precisely, FIG. 4 illustrates an example of arrangement of the conductive tracks 84 of levels 80 and 82. FIG. 4 is of course not to scale. The relative dimensions are not correct. In particular, the dimensions of region 83 located at the center of the spirals formed by the windings, and thus surrounded with the windings, are different in an operating circuit.

FIG. 4 comprises a view A illustrating the conductive tracks 84 of level 80 and a view B illustrating the conductive tracks 84 of level 82. In the example illustrated in FIG. 4, each winding 52, 54 (FIG. 2) comprises a portion on each level 80, 82.

Winding 52 comprises a portion 138 located in level 80 and a portion 140 in level 82. Winding 54 comprises a portion 142 located in level 80 and a portion 144 in level 82. The portion 138 is offset relative to the portion 140 and the portion 142 is offset relative to the portion 144.

Portion 138, formed of a track 84 of layer 80, forms a spiral winding around, that is, surrounding, region 83 in layer 80. Portion 138 comprises an end 146, for example, located outside of said spiral, that is, which is not surrounded with said spiral. Portion 138 comprises another end 148, for example, located inside of said spiral, that is, being surrounded with said spiral. Portion 138 for example alternately extends in layer 80, in an X direction and in a Y direction, substantially perpendicular to the X direction, portion 138 extending over a shorter distance at each change of direction.

The end 148 of portion 138 is coupled, by a conductive via crossing the layer(s) located between layers 80 and 82, to an end 150 of portion 140. End 150 is preferably located opposite, that is, vertically (in a Z direction orthogonal to the plane formed by the X and Y directions) aligned with, end 148.

Portion 140, formed of a track 84 in layer 82, forms a spiral winding around, that is, surrounding, region 83. Portion 140 comprises another end 152 for example located outside of said spiral, that is, which is not surrounded with said spiral. End 150 is for example located inside of said spiral, that is, being surrounded with said spiral. Portion 140 for example alternately extends, in layer 82, in the X direction and in the Y direction, portion 140 extending over a shorter distance at each change of direction.

Preferably, at least part of portion 138 is located opposite, that is, vertically aligned with, at least part of portion 144.

Similarly, portion 142, formed of a track 84 of layer 80, forms a spiral winding around, that is, surrounding, region 83 in layer 80. Portion 142 comprises an end 154, for example, located outside of said spiral, that is, which is not surrounded with said spiral. Portion 142 comprises another end 156, for example, located inside of said spiral, that is, being surrounded with said spiral. Portion 142 for example alternately extends, in layer 80, in the X direction and in the Y direction, portion 142 extending over a shorter distance at each change of direction.

The end 156 of portion 142 is coupled, by a conductive via crossing the layer(s) located between layers 80 and 82, to an end 158 of portion 144. End 158 is preferably located opposite, that is, vertically (in a Z direction orthogonal to the plane formed by the X and Y directions) aligned with, end 156.

Portion 144, formed of a track 84 in layer 82, forms a spiral rotating around, that is, surrounding, region 83. Portion 144 comprises another end 160 for example located outside of said spiral, that is, which is not surrounded with said spiral. End 158 is for example located inside of said spiral, that is, being surrounded with said spiral. Portion 144 for example alternately extends, in layer 82, in the X direction and in the Y direction, portion 144 extending over a shorter distance at each change of direction.

Preferably, at least part of portion 142 is located opposite, that is, vertically aligned with, at least part of portion 140.

The portions 138 and 142 of layer 80 are interlaced. In other words, portions 138 and 142 are parallel to each other in layer 80. Thus, each segment of portion 138, respectively 142, except for the outermost segments of portion 138 and 142, is located between two segments of portion 142, respectively 138. Thus, each segment of portion 138, respectively 142, is separated from the closest segment of portion 138, respectively 142, by a segment of portion 142, respectively 138.

Similarly, the portions 140 and 144 of layer 82 are interlaced. In other words, portions 140 and 144 are parallel to each other in layer 82. Thus, each segment of portion 140, respectively 144, except for the outermost segments of portion 140 and 144, is located between two segments of portion 144, respectively 140. Thus, each segment of portion 140, respectively 144, is separated from the closest segment of portion 140, respectively 144, by a segment of portion 144, respectively 140.

For example, end 146 corresponds to the end coupled to pad 116 by cable 118 (FIGS. 3A and 3E). Ends 148 and 150 are coupled to each other by a via 88 (FIGS. 3A and 3B). Similarly, ends 156 and 158 are coupled to each other by a via 88 (FIGS. 3A and 3B). Ends 152 and 154 are coupled to each other by a via 126 (FIG. 3A) and are coupled to terminal 44 by tracks 128 and vias 130. End 160 corresponds to the end coupled to pad 116 by cable 124 (FIGS. 3A and 3E).

Figure 5:
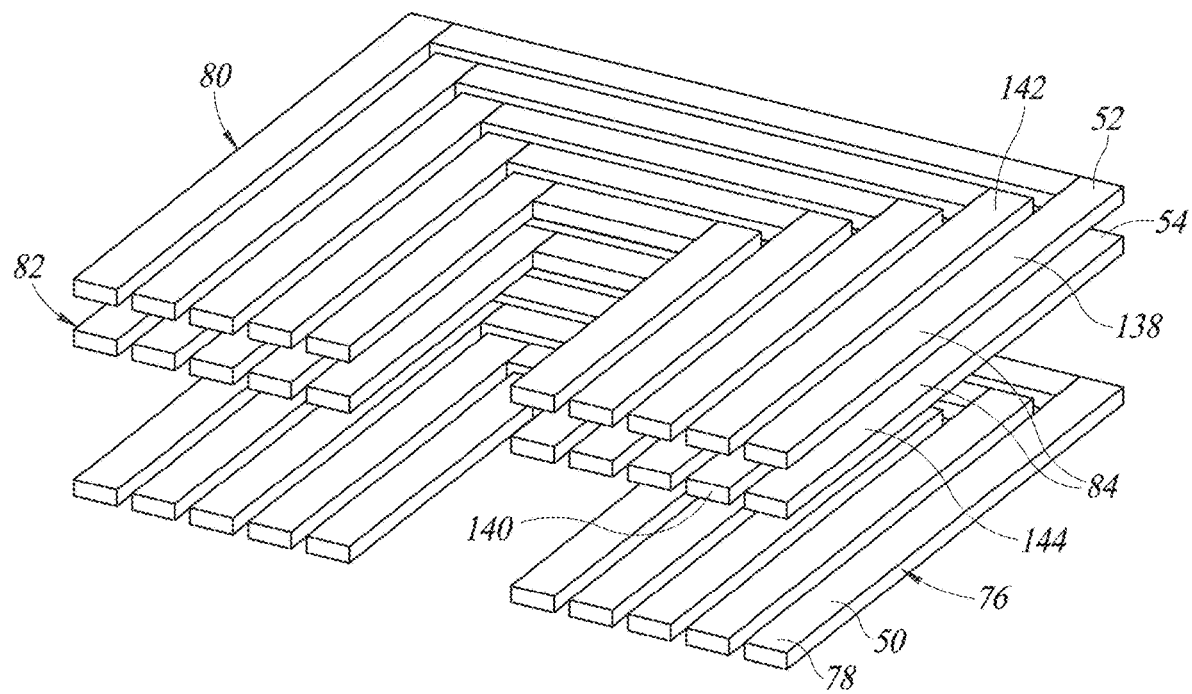
FIG. 5 shows another cross-section view of the embodiment of FIG. 3A with some layers hidden for visibility of windings within the embodiment of FIG. 3A.

FIG. 5 shows a perspective view of the embodiment of the device, or the system, in the package as shown in FIG. 3A as the device is the transformer device comprising the package 70, the package comprising a transformer circuit, for example, the circuit of FIGS. 1 and 2. The respective portions 138, 140 of the winding 52 with the respective portions 142, 144 of the winding 54 of the secondary are interlaced as discussed above. The portion 138 of the winding 52 overlaps and is aligned with the portion 144 of the winding 54 in a first direction directed away from the portion 138 towards the portion 144, and the portion 142 of the winding 54 overlaps and is aligned with the portion 140 of the winding 52 in the first direction. For example, the first direction may be in a vertical orientation based on the orientation as shown in FIG. 5.

As a variant, the primary of transformer 35 may comprise a plurality of windings, for example, two windings, for example arranged on one or a plurality of layers, for example, arranged in the same way as windings 52 and 54. According to another variant, the primary only comprises winding 50, winding 50 being located in a plurality of layers. The different portions of the winding are then coupled by a conductive via.

As a variant, windings 52 and 54 are for example each located in distinct layers. Thus, winding 52 is located in one or a plurality of first layers of the substrate and winding 54 is located in one or a plurality of second layers of the substrate, the first and second layers being preferably separated by at least one layer of the stack.

As a variant, the secondary may comprise a single winding. This single winding may be located in one or a plurality of layers.

An advantage of the embodiment of FIG. 4 is that windings 52 and 54 are similar and are substantially at the same mean distance from winding 50. There thus are fewer disparities between the windings, which enables the transformer to have a more accurate operation.

An advantage of the described embodiments is that the number and the thickness of the layers between layers 76 and 82 may be selected to ensure a selected insulation between the primary and the secondary.

Another advantage of the described embodiments is that the transformer is formed during the substrate manufacturing method. The manufacturing is thus shorter and less expensive than in a method where the transformer is formed independently.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

Device may be summarized as including at least one chip in a package, the package including a support, having the at least one chip resting thereon, and a protection layer covering the at least one chip, the support including a stack of layers made of an insulating material, a transformer being formed in the support by first and second conductive tracks.

The transformer may include a primary including one or a plurality of first windings formed by one or a plurality of the first conductive tracks.

The primary may include a single first winding formed by a first conductive track in a single layer of the stack.

The transformer may include a secondary including one or a plurality of second windings formed by one or a plurality of the second conductive tracks.

The secondary may include two second windings.

Each second winding may include a first portion in a first layer of the stack, and a second portion in a second layer of the stack.

The first portions of the second windings may be in a same first layer and may be interlaced, and the second portions may be in the same second layer and may be interlaced.

A first end of one of the second windings may be coupled to a first end of the other one of the second windings.

The first ends of the second windings may be coupled to a contact pad located in the lower layer of the support.

The first and second tracks each may form a spiral surrounding a first region.

A control circuit may be located on the support opposite the first region.

A rectifying circuit may be located on a region of the support external to the spirals formed by the first and second windings.

The support, the control circuit, and the rectifying circuit may be covered with an overmolding layer.

Second ends of the second windings may be coupled to the second circuit.

The first and second conductive tracks may be separated by layers of the stack including no conductive tracks in the region opposite the first and second conductive tracks.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a support including a stack of layers of an insulating material;
at least one chip on the support;
a protection layer covering the at least one chip; and
a transformer being in the support, the transformer including at least one first conductive track and at least one second conductive track, the transformer includes a central opening that is surrounded by the transformer, the central opening is aligned with and overlaps the at least one chip.

2. The device according to claim 1, wherein the transformer comprises a primary coil comprising one or a plurality of first windings formed by one or a plurality of the first conductive tracks.

3. The device according to claim 2, wherein the primary coil comprises a single first winding formed by a first conductive track in a single layer of the stack.

4. The device according to claim 1, wherein the transformer comprises a secondary coil comprising one or a plurality of second windings formed by one or a plurality of the second conductive tracks.

5. The device according to claim 4, wherein the secondary coil comprises two second windings.

6. The device according to claim 4, wherein each respective second winding of the second windings comprises a first portion in a first layer of the stack, and a second portion in a second layer of the stack.

7. The device according to claim 6, wherein the first portions of the second windings are in the first layer and are interlaced, and the second portions are in the second layer and are interlaced.

8. The device according to claim 4, wherein a first end of one of the second windings is coupled to a first end of the other one of the second windings.

9. The device according to claim 8, wherein the first ends of the second windings are coupled to a contact pad located in the lower layer of the support.

10. The device according to claim 1, wherein the first and second tracks each form a spiral surrounding a first region.

11. The device according to claim 10, wherein a control circuit is located on the support opposite the first region.

12. The device according to claim 1, wherein a rectifying circuit is located on a region of the support external to at least one spiral formed by one or more first windings defined by the at least one first conductive track and one or more second windings defined by the at least one second conductive track.

13. The device according to claim 12, wherein the support, the control circuit, and the rectifying circuit are covered with an overmolding layer.

14. The device according to claim 12, wherein second ends of the second windings are coupled to the rectifying circuit.

15. The device according to claim 1, wherein the first and second conductive tracks are separated by layers of the stack comprising no conductive tracks in the region opposite the first and second conductive tracks.

16. A device, comprising:
a multilayer substrate including:
a first layer;
a second layer overlaps the first layer and is spaced apart from the first layer;
a third layer overlaps the first and the second layers and is spaced apart from the first and second layers;
a transformer structure including:
a primary coil including a first winding within the first layer;
a secondary coil including:
a second winding including a first portion in the third layer and a second portion in the second layer; and
a third winding interlaced with the second winding in the second and third layers, the third winding including a third portion in the third layer and a fourth portion in the second layer, the third portion is laterally adjacent to the first portion, overlaps the second portion, and is aligned with the second portion, and the fourth portion is laterally adjacent to the second portion, is overlapped by first portion, and is aligned with the first portion.

17. The device of claim 16, further comprising a die on the multilayer substrate, and wherein:
the primary coil includes a first central opening;
the secondary coil includes a second central opening that is aligned with the first central opening and overlaps the first central opening; and
the die is aligned with the first central opening and the second central opening, and the die overlaps the first central opening and the second central opening.

18. The device of claim 17, wherein:
the multilayer substrate further includes:
an exterior;
a plurality of conductive stacks within the first central opening of the primary coil and within the second central opening of the secondary coil;
a plurality of conductive tracks coupled to the plurality of conductive stacks; and
a plurality of conductive pads coupled to the plurality of conductive tracks, the plurality of conductive pads are accessible at the exterior.

19. A device, comprising:
a multilayer substrate including:
a surface;
a transformer structure including:
a primary coil including:
a first winding within the first layer; and
a first central opening;
a secondary coil including:
a second central opening that is aligned with the first central opening and overlaps the first central opening;
a second winding including a first portion in the third layer and a second portion in the second layer; and
a third winding interlaced with the second winding in the second and third layers, the third winding including a third portion in the third layer and a fourth portion in the second layer, the third portion is laterally adjacent to the first portion, overlaps the second portion, and is aligned with the second portion, and the fourth portion is laterally adjacent to the second portion, is overlapped by first portion, and is aligned with the first portion;
a first die is on the surface of the multilayer substrate, the first die overlaps the first and second central openings, and the first die is aligned with the first and second central openings.

20. The device of claim 19, further comprising:
a second die is on the surface of the multilayer substrate and is spaced apart from the first and second central openings; and
a protection layer covers the first die, the second die, and the surface of the multilayer substrate.

* * * * *